United States Patent
Iwashita et al.

(10) Patent No.: US 8,779,704 B2
(45) Date of Patent: Jul. 15, 2014

(54) MOTOR CONTROL APPARATUS EQUIPPED WITH DELTA-SIGMA MODULATION AD CONVERTER

(71) Applicant: Fanuc Corporation, Yamanashi (JP)

(72) Inventors: Yasusuke Iwashita, Yamanashi (JP); Taku Sasaki, Yamanashi (JP)

(73) Assignee: Fanuc Corporation, Minamitsuru-Gun, Yamanashi (JP)

(*) Notice: Subject to any disclaimer, the term of this patent is extended or adjusted under 35 U.S.C. 154(b) by 0 days.

(21) Appl. No.: 13/793,346

(22) Filed: Mar. 11, 2013

(65) Prior Publication Data
US 2013/0271049 A1    Oct. 17, 2013

(30) Foreign Application Priority Data

Apr. 17, 2012    (JP) ................... 2012-093820

(51) Int. Cl.
 *H02P 6/06*    (2006.01)
(52) U.S. Cl.
 USPC ...................... 318/400.05; 318/569
(58) Field of Classification Search
 CPC ................................. G11B 20/10037
 USPC .......................... 318/400.05, 569
 See application file for complete search history.

(56) References Cited

U.S. PATENT DOCUMENTS

| | | | |
|---|---|---|---|
| 7,034,490 B2 * | 4/2006 | Sawtell et al. | 318/569 |
| 7,224,135 B1 * | 5/2007 | Menegoli et al. | 318/400.26 |
| 2009/0121908 A1 * | 5/2009 | Regier | 341/142 |
| 2010/0007294 A1 | 1/2010 | Hasegawa et al. | |
| 2010/0201299 A1 | 8/2010 | Emde et al. | |
| 2010/0214809 A1 | 8/2010 | Iwashita et al. | |
| 2011/0274415 A1 | 11/2011 | Schmidtlein et al. | |
| 2012/0200524 A1 * | 8/2012 | Vallis et al. | 345/174 |
| 2013/0279225 A1 * | 10/2013 | Choi et al. | 363/98 |

FOREIGN PATENT DOCUMENTS

| | | |
|---|---|---|
| DE | 102008040925 A1 | 4/2009 |
| DE | 102008040929 A1 | 2/2010 |
| DE | 102010007184 A1 | 11/2010 |
| JP | 10191678 A | 7/1998 |
| JP | 2004304494 A | 10/2004 |
| JP | 2008-147809 A | 6/2008 |

OTHER PUBLICATIONS

Corresponding Japanese Application No. 2012-093820 Office Action dated Jun. 25, 2013.
Office Action mailed Feb. 4, 2014, corresponds to German patent application No. 102013006197.0.

* cited by examiner

*Primary Examiner* — Erick Glass
(74) *Attorney, Agent, or Firm* — Lowe Hauptman & Ham, LLP

(57) ABSTRACT

A motor control apparatus includes a power conversion unit which supplies drive power to a motor, a current detection unit which detects the value of a current flowing from the power conversion unit to the motor, a delta-sigma modulation AD converter which converts the current value into digital data by using a modulation clock as a system clock, and which starts to count the number of clock pulses of the modulation clock upon reception of a reference signal and, when the number of clock pulses counted reaches a predetermined count value, outputs the digital data obtained during a prescribed time interval which contains the reception time of the reference signal, and a command generating unit which generates, using the digital data supplied from the delta-sigma modulation AD converter, a drive command for commanding the power conversion unit to output commanded drive power.

9 Claims, 6 Drawing Sheets

US 8,779,704 B2

MOTOR CONTROL APPARATUS EQUIPPED WITH DELTA-SIGMA MODULATION AD CONVERTER

RELATED APPLICATIONS

The present application is based on, and claims priority from, Japanese Application Number 2012-093820, filed Apr. 17, 2012, the disclosure of which is hereby incorporated by reference herein in its entirety.

BACKGROUND OF THE INVENTION

1. Field of the Invention

The present invention relates to a motor control apparatus equipped with a delta-sigma modulation AD converter, and more specifically to a motor control apparatus equipped with a delta-sigma modulation AD converter that is used to detect the current flowing in each winding of a motor.

2. Description of the Related Art

A motor control apparatus for driving motors used in a machine tool, a forging press, an injection molding machine, an industrial robot, or the like, commands motor speed, torque, or rotor position in order to control the operation of each of the motors provided one for each drive axis. In such a motor control apparatus, it is important to accurately detect the current flowing in each winding of the motor. The current value detected on each winding of the motor is converted by an AD (analog-digital) converter into digital data which is used to control the driving of the motor. Successive approximation and delta-sigma modulation are two major types of AD converters used in conventional motor control apparatus, but, the delta-sigma modulation-type is becoming none predominant.

FIG. 8 is a block diagram showing a conventional motor control apparatus that uses a delta-sigma modulation AD converter. Generally, the motor control apparatus 101 which drives and controls a three-phase AC motor 2 includes a power conversion unit 51 which supplies drive power to the motor 2, a current detection unit 52 which detects the value of the current flowing from the power conversion unit 51 to each winding of the motor 2, a delta-sigma modulation AD (analog-digital) converter 53 which converts the value of the current detected by the current detection unit 52 into digital data, and a command generating unit 54 which generates, using the digital data supplied from the delta-sigma modulation AD converter 53, a drive command for commanding the power conversion unit 51 to output the drive power for driving the motor 2. The power conversion unit 51 is, for example, an inverter circuit and/or a converter circuit. The current detection unit 52 actually includes two current detection units one for each of two of the three phase windings of the three-phase AC motor. In the thus configured motor control apparatus 101, the command generating unit 54 generates the drive command based on the digital data acquired by AD-converting the current flowing in each winding of the motor 2.

FIG. 9 is a block diagram showing a conventional delta-sigma modulation AD converter. The delta-sigma modulation AD converter 53 includes two major sections, i.e., a modulator (delta-sigma modulation circuit) 61 and a digital low-pass filter 62, both of which operate on a system clock called a modulation clock whose frequency is generally about several to several tens of megahertz. The modulator 61 converts the input analog data into a high-speed low-bit bitstream signal. A large amount of quantization noise generated here is removed by the digital low-pass filter 62, and the resulting data is output as the digital data. Generally, the digital data from the delta-sigma modulation AD converter 53 is output at a rate reduced by decimating the modulation clock by a predetermined factor. This factor is generally referred to as the decimation ratio.

In the motor control apparatus 101, the rate reduced by decimating the modulation clock by the predetermined factor, i.e., the rate at which the digital data is output from the delta-sigma modulation AD converter 53, is not always synchronized to the digital data acquisition rate (generally, several to several tens of kilohertz), which defines the control period of the command generating unit 54 in the motor control apparatus 101. As a result, the delta-sigma modulation AD converter 53 may not output the digital data when the command generating unit 54 desires to acquire the digital data and, consequently, the command generating unit 54 may not be able to acquire the digital data with timing appropriate for current control. To address this, use may be made of a digital low-pass filter configured to be able to continuously output the digital data for each modulation clock period. With this configuration, the digital data output by the most recent modulation clock can be acquired by the command generating unit 54 at the desired timing for each control period, without having to consider the synchronization with the modulation clock.

Generally, in the motor control apparatus, it is important to clearly identify the time instant to which belongs the value of the current detected by the current detection unit 52 and AD-converted into the digital data to be used for the creation of the drive command in the command generating unit. FIG. 10 is a basic principle diagram for explaining AD conversion and digital data acquisition timings in the motor control apparatus equipped with the conventional delta-sigma modulation AD converter. In principle, the delta-sigma modulation AD converter 53 AD-converts analog data in a given "time interval", and this "time interval" is defined as a value equal to the modulation clock period multiplied by the decimation ratio. As a result, in the case of the delta-sigma modulation AD converter 53, unlike, for example, the case of an successive approximation AD converter, it is difficult to identify the time instant to which the continuous analog data sampled and AD-converted into the digital data belongs. Therefore, in the case of the delta-sigma modulation AD converter 53, it is common to regard the midpoint of the "digital data output time interval B" as being the "AD conversion time instant", as illustrated in FIG. 10. More specifically, the command generating unit 54 connected to the delta-sigma modulation AD converter 53 acquires the digital data from the delta-sigma modulation AD converter 53 at time instant A when a time D equal to one half of the "digital data output time interval B" has elapsed from time instant C corresponding to the midpoint of the "digital data output time interval B". Since the "digital data output time interval B" is defined as a value equal to the modulation clock period multiplied by the decimation ratio, as described above, the time D is specified to be one half of the time interval B. That is, once the "time instant C at which to AD-convert the current value (analog data)" is determined, the command generating unit 54 acquires the digital data from the delta-sigma modulation AD converter 53 when the "time D equal to one half of the modulation clock period multiplied by the decimation ratio" has elapsed from the time instant C. Whether the time D has elapsed or not is determined by the command generating unit 54, but the modulation clock as the system clock of the delta-sigma modulation AD converter 53 is not always synchronized to the system clock of the command generating unit 54, and their clock periods vary due to various factors. In the prior art, therefore, the command generating unit 54 has estimated the time D by assuming ideal conditions in which the modulation clock does not vary. Accordingly, in the motor control apparatus 101 equipped with the delta-sigma modulation AD converter 53, as the modulation clock period varies, the motor control accuracy correspondingly degrades.

For a motor control apparatus that controls a motor by using a delta-sigma modulation AD converter for converting the current value detected on each winding of the motor into digital data, several proposals have been made in the prior art to enhance the current detection accuracy. For example, according to the invention disclosed in Japanese Unexamined Patent Publication No. 2008-147809, the current detection accuracy is enhanced by additionally providing a PLL circuit in order to enhance the accuracy of the modulation clock in the modulator section provided in the first stage of the delta-sigma modulation AD converter.

However, in reality, the modulation period varies due to various factors. In the delta-sigma modulation AD converter 53, when the modulation clock period used as the system clock varies, the length of the "digital data output time interval B" also varies greatly. FIG. 11 is a diagram for explaining variations in the AD conversion and digital data acquisition timings in the motor control apparatus equipped with the conventional delta-sigma modulation AD converter. In FIG. 11, "a" indicates the case where the length of the "digital data output time interval" becomes shorter than the specified time length because the modulation clock period is short, and "b" indicates the case where the length of the "digital data output time interval" is the same as the specified time length because there is no variation in the modulation clock, while "c" indicates the case where the length of the "digital data output time interval" becomes longer than the specified time length because the modulation clock period is long. When the modulation clock period varies, and the length of the "digital data output time interval" varies correspondingly, as indicated by B1, B2, and B3, respectively, the time instant corresponding to the "midpoint of the digital data output time interval B" changes as indicated by C1, C2, and C3. When there is no variation in the modulation clock (the case "b"), the "time instant at which the command generating unit 54 acquires the digital data from the delta-sigma modulation AD converter" coincides with the "midpoint C2 of the digital data output time interval B", but when the modulation clock period is short (the case "a"), or when the modulation clock period is long (the case "c"), the "time instant C at which to AD-convert the current value (analog data)" which is determined by the "time instant at which the command generating unit 54 acquires the digital data from the delta-sigma modulation AD converter" becomes displaced from the "midpoint of the digital data output time interval B". In this way, according to the prior art method, when the modulation clock period varies, the motor cannot be driven and controlled with good accuracy.

Further, the command generating unit 54 is operating asynchronously with respect to the modulation clock. Therefore, when such a displacement occurs, there is no knowing whether the digital data obtained by AD conversion is the data obtained by AD-converting the current value at the specified time instant, and it becomes difficult to achieve high-accuracy motor drive control.

Further, when the power conversion unit 51 is a power converter such as an inverter circuit that uses a semiconductor switching device, it is desirable that the AD conversion timing be strictly specified in order to avoid the effects of noise due to the switching, etc., of the semiconductor switching device, but when the modulation clock period varies, as described above, since the length of the "digital data output time interval B" also varies, it is difficult to reduce the effects of noise due to the switching, etc., of the semiconductor switching device.

Furthermore, according to the invention disclosed in Japanese Unexamined Patent Publication No. 2008-147809, since the modulation clock is also transmitted via an "insulating means" to the digital low-pass filter at the subsequent stage in the delta-sigma modulation AD converter, variation in the modulation clock affects the digital low-pass filtering operation, and it is not possible to sufficiently enhance the motor control accuracy.

SUMMARY OF THE INVENTION

In view of the above problem, it is an object of the present invention to provide a motor control apparatus equipped with a delta-sigma modulation AD converter that can highly accurately control the driving of a motor and that can avoid the effects of noise due to the switching, etc., of a semiconductor switching device provided in a power converter that supplies drive power to the motor.

To attain the above object, according to the invention, a motor control apparatus comprising: a power conversion unit which supplies drive power to a motor; a current detection unit which detects the value of a current flowing from the power conversion unit to the motor; a delta-sigma modulation AD converter which converts the current value detected by the current detection unit into digital data by using a modulation clock as a system clock, wherein the delta-sigma modulation AD converter starts to count the number of clock pulses of the modulation clock upon reception of a reference signal and, when the number of clock pulses counted reaches a predetermined count value, outputs the digital data obtained during a prescribed time interval which contains the reception time of the reference signal; and a command generating unit which generates, using the digital data supplied from the delta-sigma modulation AD converter, a drive command for commanding the power conversion unit to output commanded drive power is provided.

The motor control apparatus further includes a reference signal generating unit which generates and outputs the reference signal as a signal that defines timing for the command generating unit to acquire a current value necessary to create the desired drive command from the current value detected by the current detection unit.

The delta-sigma modulation AD converter includes: a modulator which outputs a bitstream signal by delta-sigma modulating the current value supplied from the current detection unit by using the modulation clock as the system clock; and a digital low-pass filter which, when the number of clock pulses started to be counted upon reception of the reference signal reaches the predetermined count value, outputs the digital data by removing quantization noise from the bitstream signal output during the prescribed time interval that contains the reception time of the reference signal.

The delta-sigma modulation AD converter includes a counter which starts to count the number of clock pulses of the modulation clock upon reception of the reference signal.

The predetermined count value is set equal to one half of the number of modulation clock pulses that corresponds to the prescribed time interval.

The length of the time interval may be set in accordance with a time interval between two switching actions of a switching device that respectively occur before and after the time that the number of clock pulses counted reaches the predetermined count value.

The length of the time interval may be set in accordance with the magnitude of a motor voltage application command which is used to create the drive command that the command generating unit supplies to the power conversion unit.

The motor control apparatus may further include a speed detection unit which detects rotational speed of the motor, and the length of the time interval may be set in accordance with the rotational speed of the motor detected by the speed detection unit.

The motor control apparatus may be a control apparatus that controls a motor for driving a feed axis of a machine tool that performs cutting, and the length of the time interval may set so as to differ when the machine tool is performing a cutting operation than when the machine tool is performing a non-cutting operation.

The power conversion unit may be a power converter that converts input power to desired output power by switching on and off a switching device provided therein. In this case, the command generating unit generates and outputs a PWM switching signal for controlling the switching operation of the switching device as the drive command by using a triangular carrier signal to be used for triangular wave comparison PWM switching control and the digital data supplied from the delta-sigma modulation AD converter. Further, in this case, the reference signal is a signal synchronized to a peak timing of the triangular carrier signal.

The predetermined count value may be set equal to one half of the number of modulation clock pulses that corresponds to the prescribed time interval, and the length of the time interval may be set in accordance with a carrier frequency of the triangular carrier signal and may be set shorter than a time interval between two switching actions of the switching device that respectively occur before and after the time that the number of clock pulses counted reaches the predetermined count value.

BRIEF DESCRIPTION OF THE DRAWINGS

The present invention will be more clearly understood with reference to the following accompanying drawings.

DETAILED DESCRIPTION

A motor control apparatus equipped with a delta-sigma modulation AD converter will be described below with reference to the drawings. It should, however, be understood that the present invention is not limited to the drawings, nor is it limited to any particular embodiment described herein.

Figure 1:
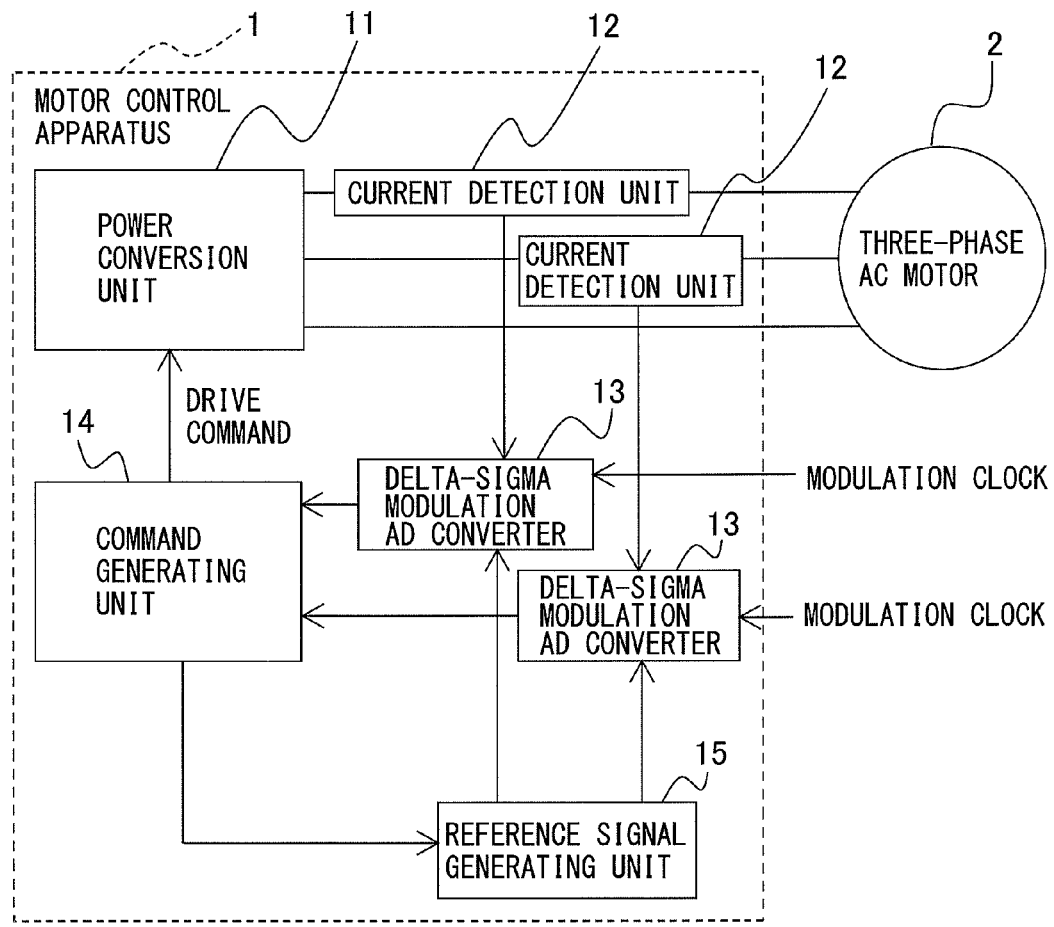
FIG. 1 is a block diagram showing a motor control apparatus equipped with a delta-sigma modulation AD converter according to an embodiment of the present invention.
Figure 2:
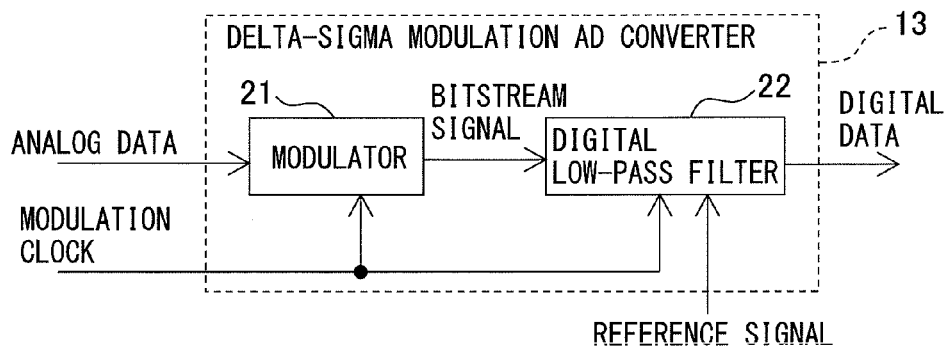
FIG. 2 is a block diagram showing the delta-sigma modulation AD converter provided in the motor control apparatus according to the embodiment.
Figure 3:
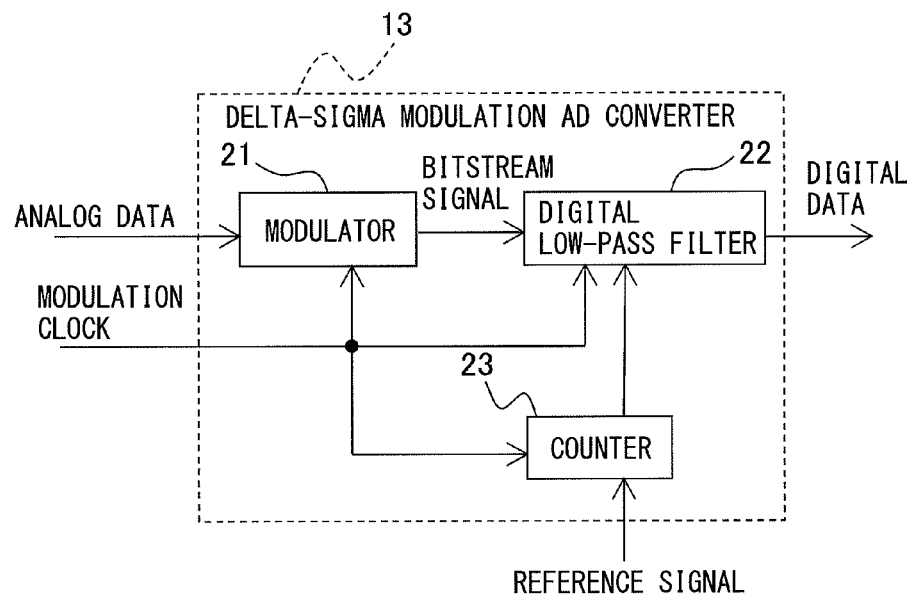
FIG. 3 is a block diagram showing the delta-sigma modulation AD converter provided in the motor control apparatus according to the embodiment.

FIG. 1 is a block diagram showing a motor control apparatus equipped with a delta-sigma modulation AD converter according to an embodiment of the present invention. FIGS. 2 and 3 are block diagrams showing the delta-sigma modulation AD converter provided in the motor control apparatus according to the embodiment.

The motor control apparatus 1 according to the embodiment includes, as shown in FIG. 1, a power conversion unit 11, a current detection unit 12, a delta-sigma modulation AD converter 13, a command generating unit 14, and a reference signal generating unit 15. The delta-sigma modulation AD converter 13 in the motor control apparatus 1 includes a modulator 21 and a digital low-pass filter 22.

The power conversion unit 11 supplies drive power to a motor 2 in accordance with a drive command supplied from the command generating unit 14. In the embodiment, the power conversion unit 11 is constructed from a power converter that converts input power to desired output power with its internal switching device being switched on and off under PWM control. When the power conversion unit 11 shown in FIG. 1 is constructed from an inverter circuit, DC power is input to the power conversion unit 11 constructed from the inverter circuit, and the input power is converted to desired AC output power by the switching operation of the switching device provided in the power conversion unit 11. On the other hand, when the power conversion unit 11 shown in FIG. 1 is constructed, for example, from a converter circuit and inverter circuit connected together by a DC link unit, AC power is input to the power conversion unit 11 constructed from the converter circuit and inverter circuit, and the input power is first converted to DC power which is then converted to desired AC output power by the switching operations of the switching devices provided in the power conversion unit 11.

The current detection unit 12 detects the value of the current flowing from the power conversion unit 11 to the motor 2. The current detection unit 12, which actually includes two current detection units, need only be provided for two of the three phase windings of the three-phase AC motor by considering the three-phase balance. Analog data representing the detected current value is supplied to the delta-sigma modulation AD converter 13.

The delta-sigma modulation AD converter 13 converts the value of the current (analog data) detected by the current detection unit 52 into digital data by using a modulation clock as a system clock. The delta-sigma modulation AD converter 13 is actually two delta-sigma modulation AD converters, provided one for each of the current detection units 12; the operation and configuration of the delta-sigma modulation AD converter 13 will be described in detail later.

The reference signal generating unit 15 generates a signal that defines the timing for the command generating unit 14 to acquire a current value necessary to create a desired drive command from the current value detected by the current detection unit 12. Its operation will be described later.

Using the digital data supplied from the delta-sigma modulation AD converter 13, the command generating unit 14 generates a drive command for commanding the power conversion unit 51 to output commanded drive power. As described above, in the embodiment, the power conversion unit 11 is constructed from a power converter that converts input power to desired output power through the PWM control of its internal switching device. Therefore, in the embodiment, the command generating unit 14 compares a triangular carrier signal with a motor application voltage command calculated based on the digital data supplied from the delta-sigma modulation AD converter 13 and, based on the result of the comparison between the triangular carrier signal and the motor application voltage command, generates and outputs a PWM switching signal for controlling the PWM switching operation of the switching device. Then, the power conversion unit 11 constructed from the power converter converts the input power to the desired output power with its internal switching device being switched on and off under PWM control based on the PWM switching signal supplied as the drive command from the command generating unit 14.

Figure 4:
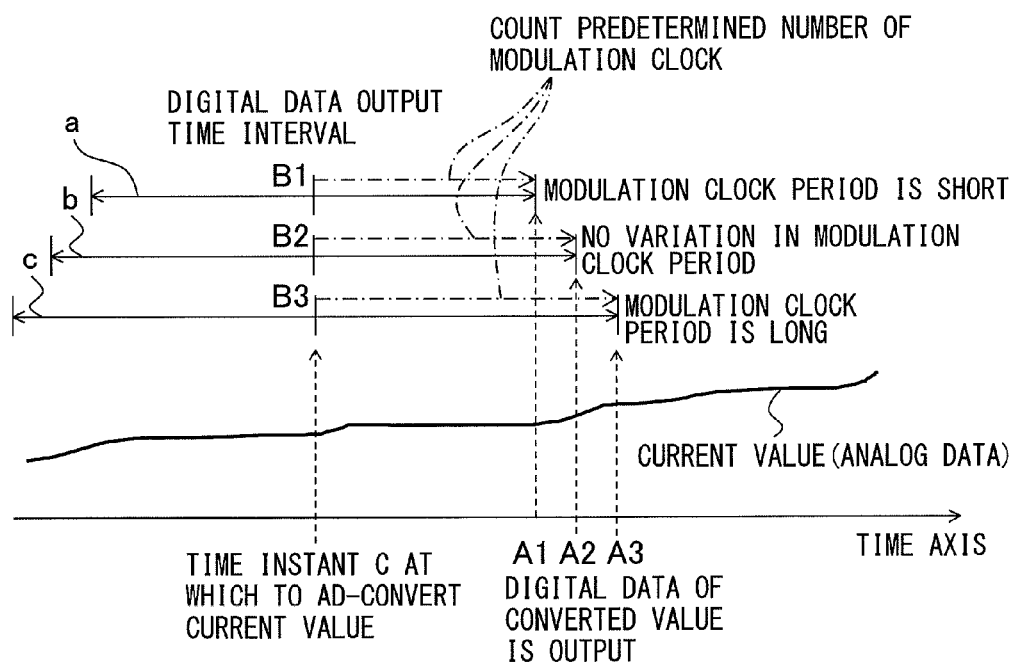
FIG. 4 is a basic principle diagram for explaining AD conversion and digital data acquisition timings in the motor control apparatus equipped with the delta-sigma modulation AD converter according to the embodiment.

Next, the operation of the delta-sigma modulation AD converter 13 and command generating unit 14 according to the embodiment will be described with reference to FIG. 4. FIG. 4 is a basic principle diagram for explaining AD conversion and digital data acquisition timings in the motor control apparatus equipped with the delta-sigma modulation AD converter according to the embodiment.

In the embodiment, the delta-sigma modulation AD converter 13 is constantly performing processing for converting the current value detected by the current detection unit 12 into digital data, but outputs only the digital data obtained during a prescribed time interval. That is, the delta-sigma modulation AD converter 13 starts to count the number of clock pulses of the modulation clock upon reception of the reference signal and, when the number of clock pulses counted reaches a predetermined count value, outputs the digital data obtained during the prescribed time interval which contains the reception time of the reference signal. The predetermined count value here is set equal to one half of the number of modulation clock pulses that corresponds to the prescribed time interval.

As described above, the delta-sigma modulation AD converter 13 is, in principle, constantly performs processing for converting the current value detected by the current detection unit 12 into digital data, but outputs only the digital data obtained during the "time interval" that is defined by counting the number of modulation clock pulses. As a result, in the delta-sigma modulation AD converter 13, when the modulation clock period used as the system clock varies, the length of the "time interval of the digital data output from the delta-sigma modulation AD converter 13" also varies in corresponding fashion. The "time interval of the digital data output from the delta-sigma modulation AD converter 13" will hereinafter be called simply as the "digital data output time interval B". In FIG. 4, "a" indicates the case where the length of the "digital data output time interval" becomes shorter than the specified time length because the modulation clock period is short, and "b" indicates the case where the length of the "digital data output time interval" is the same as the specified time length because there is no variation in the modulation clock, while "c" indicates the case where the length of the "digital data output time interval" becomes longer than the specified time length because the modulation clock period is long. Consider the situation where the modulation clock period varies, causing the length of the "digital data output time interval" to vary in corresponding fashion, as indicated by B1, B2, and B3, respectively.

In the embodiment, the delta-sigma modulation AD converter 13 starts to count the number of modulation clock pulses upon reception of the reference signal and, when the number of clock pulses counted reaches the predetermined count value, outputs the digital data, i.e., the AD-converted value obtained during the prescribed time interval that contains the reception time of the reference signal; in this case, the "signal based on the timing for the command generating unit to acquire the current value necessary to create the desired drive command from the current value detected by the current detection unit" is used as the reference signal. This reference signal is generated by the reference signal generating unit 15. That is, in the embodiment, the "timing for the command generating unit to acquire the current value necessary to create the desired drive command from the current value detected by the current detection unit" is adopted as the "time instant C at which to AD-convert the current value". Then, the delta-sigma modulation AD converter 13 starts to count the number of clock pulses of the modulation clock upon reception of this reference signal and, when the number of clock pulses counted reaches the predetermined count value, outputs the digital data, i.e., the AD-converted data obtained during the prescribed time interval that contains the reception time of the reference signal. More specifically, the counting of the number of modulation clock pulses is started at the "time instant C at which to AD-convert the current value" and, when the number of pulses counted reaches one half of the number of modulation clock pulses that corresponds to the "digital data output time interval", the digital data, i.e., the AD-converted data obtained during the "digital data output time interval" that contains the reception time of the reference signal, is output.

In the embodiment, when the delta-sigma modulation AD converter 13 is configured as described above, the digital data obtained during the time interval, which is invariably centered at the time at which to AD-convert the current value, is output irrespective of the variation of the modulation clock period. The "digital data output time interval" varies depending on the modulation clock period; for example, as shown in FIG. 4, when the modulation clock period varies as indicated by "a", "b", and "c", the "digital data output time interval" varies, as indicated by B1, B2, and B3, respectively, but the "time instant C at which to AD-convert the current value" is always the same irrespective of the modulation clock period. More specifically, in the embodiment, the digital data after the AD conversion is output at time instant A1, A2, or A3, respectively, when a time equal to one half of the "digital data output time interval (B1, B2, or B3)" has elapsed from the "time instant C at which to AD-convert the current value" that occurs at the "midpoint of the digital data output time interval".

As earlier described, the "time instant C at which to AD-convert the current value" corresponds to the timing for the command generating unit 14 to acquire the current value necessary to create the desired drive command from the current value detected by the current detection unit 12, and the reference signal generating unit 15 generates and outputs the reference signal that defines this timing. The timing to acquire the current value necessary to create the desired drive command is determined by the command generating unit 14; therefore, the reference signal generating unit 15 receives the current value acquisition command from the command generating unit 14, and supplies the reference signal to the delta-sigma modulation AD converter 13. Since the delta-sigma modulation AD converter 13 outputs the digital data after a predetermined time has elapsed from the reception of the reference signal, the command generating unit 14 can acquire the digital data as desired.

The delta-sigma modulation AD converter 13 described above includes, as shown in FIG. 2, the modulator 21 which outputs a bitstream signal by delta-sigma modulating the current value, i.e., the analog data supplied from the current detection unit 12, by using the modulation clock as the system clock, and the digital low-pass filter 22 which, when the number of clock pulses started to be counted upon reception of the reference signal reaches the predetermined count value, outputs the digital data by removing quantization noise from the bitstream signal output during the prescribed time interval that contains the reception time of the reference signal. The digital low-pass filter 22 includes a memory (not shown) for temporarily holding the digital data. Further, the digital low-pass filter 22 includes the function of a counter that starts to count the number of modulation clock pulses upon reception of the reference signal, but in a modified example, a counter 23 that starts to count the number of modulation clock pulses upon reception of the reference signal may be provided separately from the digital filter 22, as shown in FIG. 3.

Next, a description will be given of how the "digital data output time interval" is set.

Figure 5:
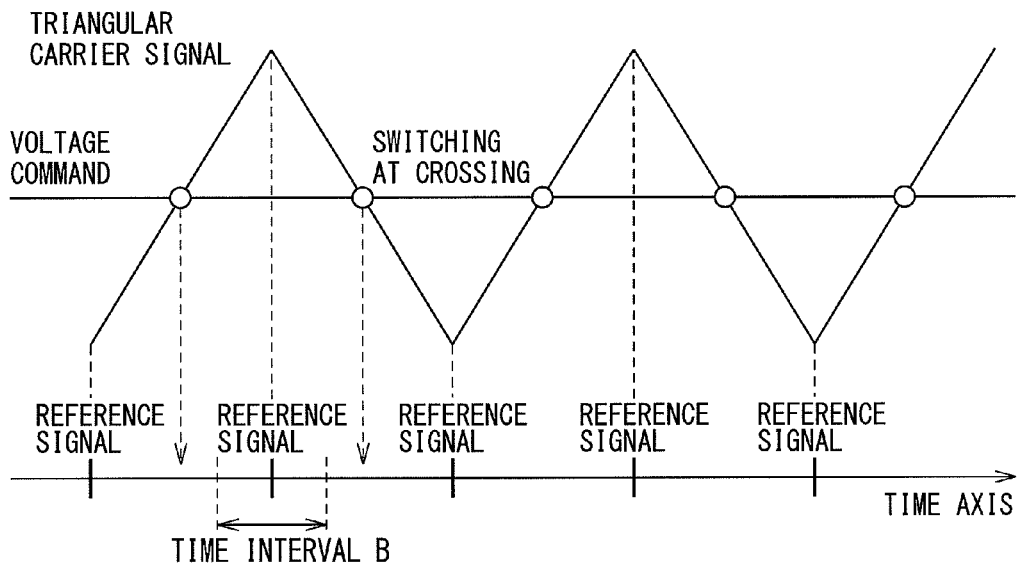
FIG. 5 is a diagram for explaining a reference signal that a reference signal generating unit according to the embodiment generates.

As earlier described, the power conversion unit 11 is constructed from a power converter that converts input power to desired output power with its internal switching device being switched on and off under PWM control. In view of this, the command generating unit 14 compares a triangular carrier signal with a motor application voltage command calculated based on the digital data supplied from the delta-sigma modulation AD converter 13 and, based on the result of the comparison between the triangular carrier signal and the motor application voltage command, generates and outputs a PWM switching signal, as a drive command to be used for PWM switching control, for controlling the switching operation of the switching device. In the embodiment, the reference signal generating unit 15 outputs the reference signal by synchronizing its timing with the peak timing of the triangular carrier signal. FIG. 5 is a diagram for explaining the reference signal that the reference signal generating unit according to the embodiment generates. As shown in FIG. 5, the command generating unit 14 that performs the PWM switching control based on the comparison of the triangular carrier signal compares the triangular carrier signal with the voltage command calculated based on the digital data acquired from the delta-sigma modulation AD converter 13 and, based on the result of the comparison, generates the PWM switching signal such that the switching operation of the semiconductor switching device is performed at time instant (indicated by a circle in the figure) at which the voltage command crosses the triangular carrier signal. Accordingly, in the embodiment, the reference signal generating unit 15 outputs the reference signal whose timing is synchronized to the peak timing of the triangular carrier signal. In this way, the "digital data output time interval" can be efficiently set so as not to temporally overlap the timing of the semiconductor switching device as much as possible. More specifically, the length of the "digital data output time interval" should be set as short as possible compared with the time interval between the two switching actions of the semiconductor switching device that respectively occur before and after the time instant (i.e., the boundary of the "digital data output time interval") at which the number of clock pulses counted reaches the predetermined count value. By so setting the output time interval, the effects of noise due to the switching, etc., of the semiconductor switching device can be reduced.

Figure 6:
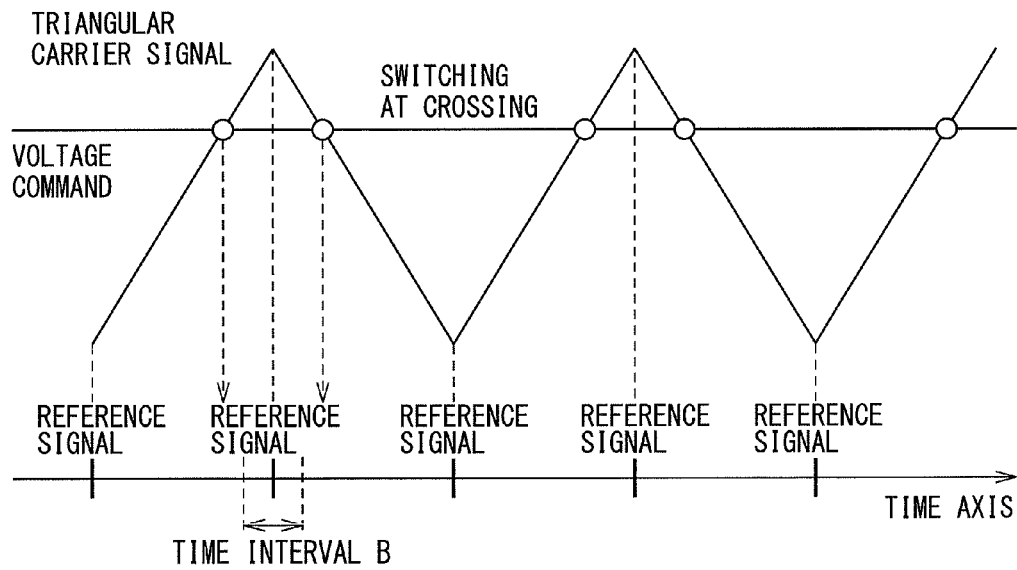
FIG. 6 is a diagram (part 1) for explaining how "digital data output time interval" is set according to the embodiment.

FIG. 6 is a diagram (part 1) for explaining how the "digital data output time interval" is set. The motor control apparatus 1 increase the voltage to be applied to the motor 2 during acceleration, deceleration, or high-speed high-output operation of the motor 2. As a result, the voltage command calculated based on the digital data acquired from the delta-sigma modulation AD converter 13 crosses the triangular carrier signal at time instants close to the peak of the triangular carrier signal. Accordingly, when the voltage to be applied to the motor 2 is increased in such cases as the acceleration, deceleration, or high-speed rotation of the motor 2, the "digital data output time interval" is set shorter than the case shown in FIG. 5 so that the time interval does not temporally overlap the switching timing of the semiconductor switching device. Since there is correlation between the voltage applied to the motor and the rotational speed of the motor, as described above, the "digital data output time interval" may be set so as to vary according to the magnitude of the motor application voltage commanded by the drive command that the command generating unit issues to instruct the power conversion unit to supply the necessary drive power, or according to the rotational speed of the motor detected by a speed detection unit (not shown) mounted on the motor 2. When the motor control apparatus 1 according to the embodiment is used to control the motor for driving the feed axis of a machine tool that performs cutting, it is preferable to set the length of the "digital data output time interval" different when the machine tool is performing a cutting operation than when it is performing a non-cutting operation. That is, since the magnitude of the voltage applied to the motor is different when the machine tool is performing a cutting operation than when it is performing a non-cutting operation, the length of the "digital data output time interval" may be set so as to be varied in real time as the machine tool is switched between the cutting and non-cutting operations.

Figure 7:
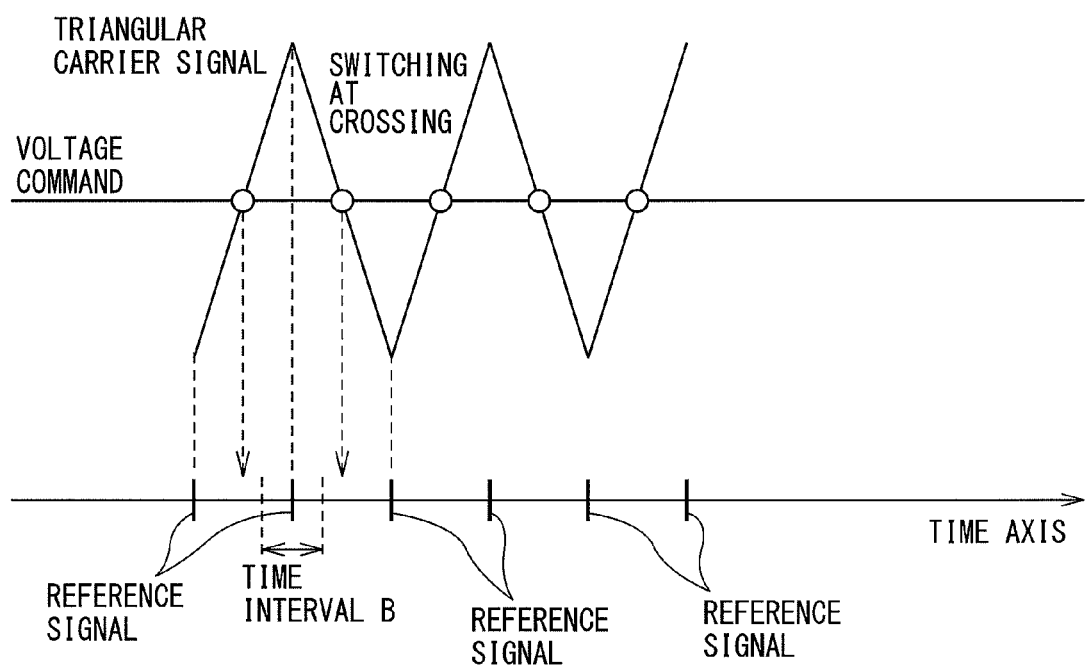
FIG. 7 is a diagram (part 2) for explaining how "digital data output time interval" is set according to the embodiment.
Figure 8:
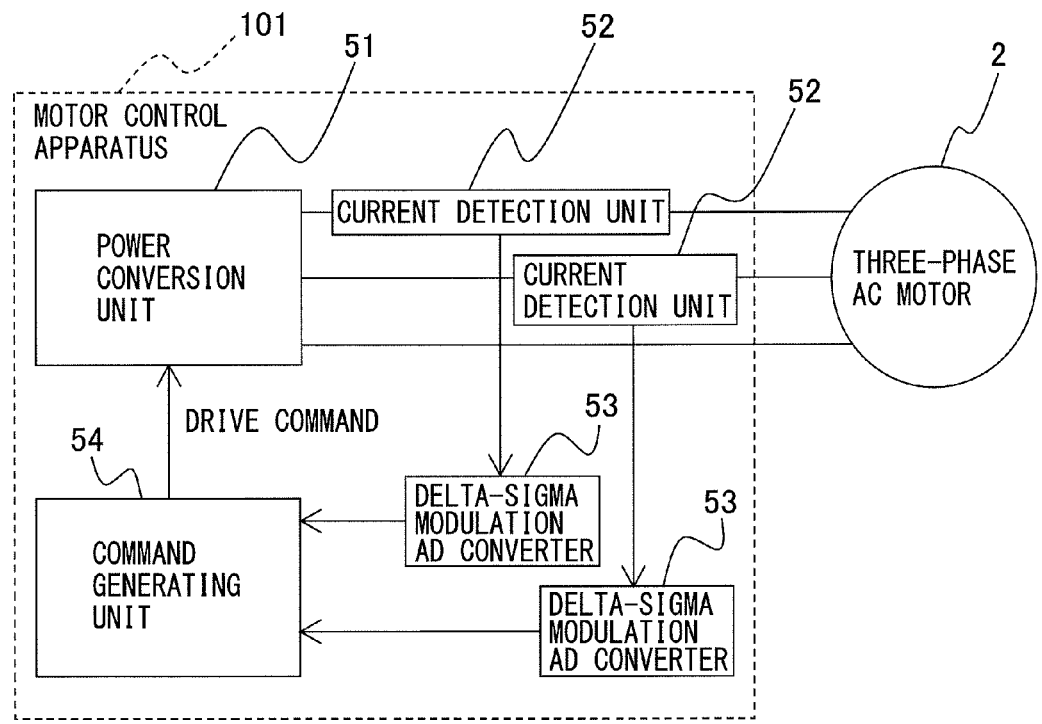
FIG. 8 is a block diagram showing a conventional motor control apparatus that uses a delta-sigma modulation AD converter.
Figure 9:
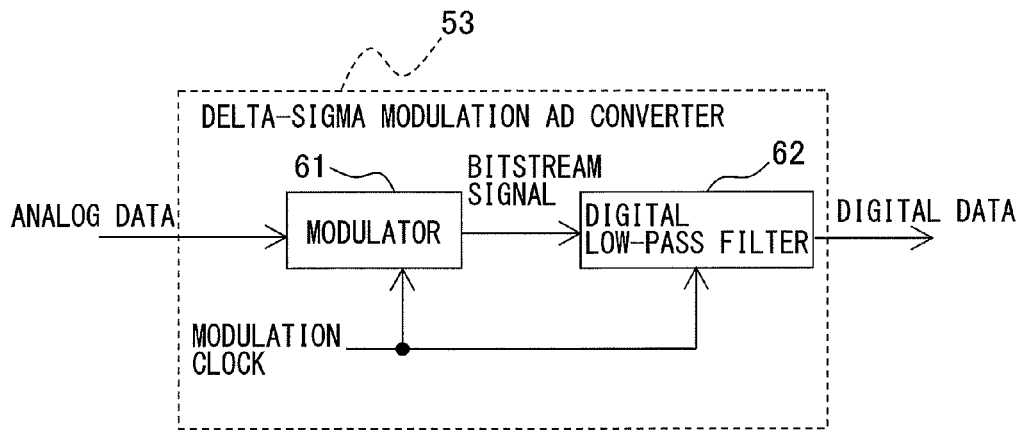
FIG. 9 is a block diagram showing a conventional delta-sigma modulation AD converter.
Figure 10:
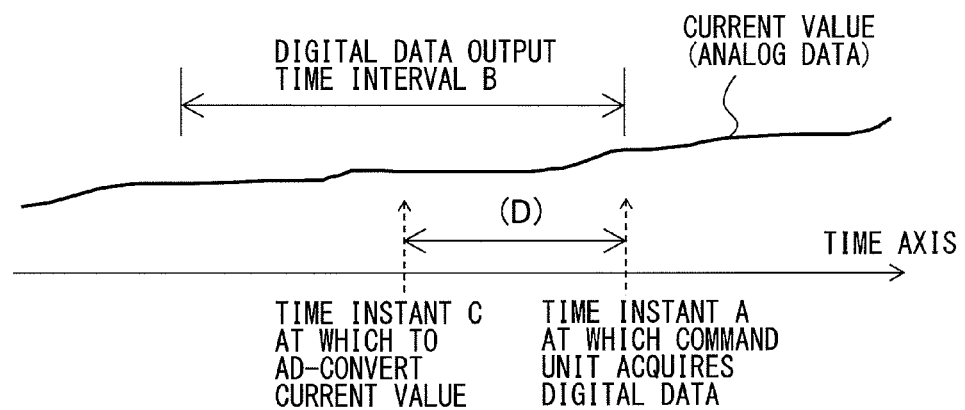
FIG. 10 is a basic principle diagram for explaining AD conversion and digital data acquisition timings in the motor control apparatus equipped with the conventional delta-sigma modulation AD converter.
Figure 11:
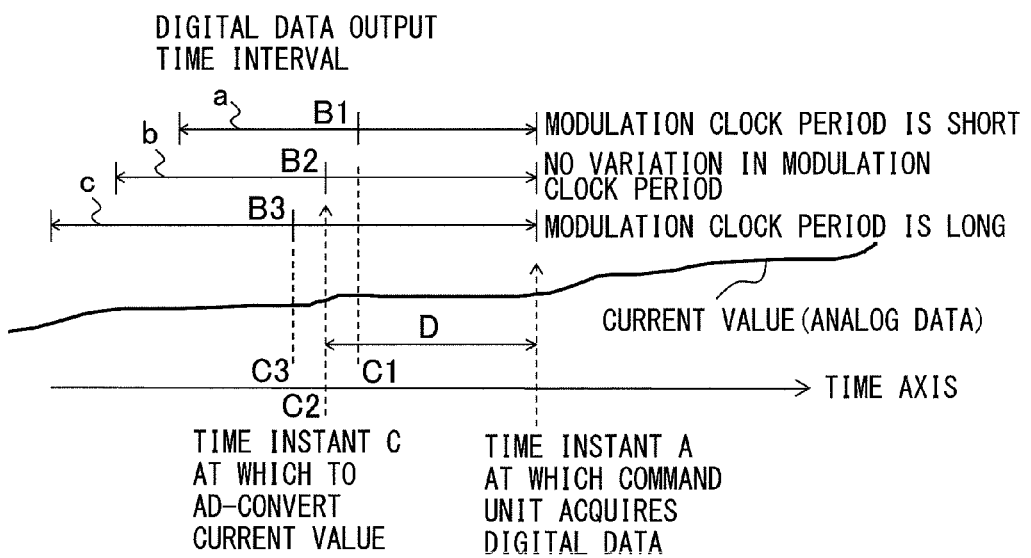
FIG. 11 is a diagram for explaining variations in the AD conversion and digital data acquisition timings in the motor control apparatus equipped with the conventional delta-sigma modulation AD converter.

FIG. 7 is a diagram (part 2) for explaining how the "digital data output time interval" is set. As the frequency of the triangular carrier increases, the time interval between the switching actions of the semiconductor switching device necessarily becomes shorter; to address this, the "digital data output time interval" may be set so as to vary according to the frequency of the triangular carrier signal. That is, when the frequency of the triangular carrier signal is high, the "digital data output time interval" is set correspondingly shorter to reduce the effects of the switching noise of the semiconductor switching device; conversely, when the frequency of the triangular carrier signal is low, the "digital data output time interval" is set correspondingly longer to increase the number of sampling points and thereby increase the AD conversion accuracy.

As described with reference to FIGS. 6 and 7, setting the "digital data output time interval" shorter means reducing the number of sampling points to be passed through the digital low-pass filter 22, i.e., reducing the AD conversion accuracy, but generally the advantage of being able to reduce the effects of the switching noise of the semiconductor switching device outweighs the disadvantage.

While the motor control apparatus of the above embodiment has been described by taking as an example the inverter circuit that drives and controls the motor 2, the present invention is also applicable for detecting the current on the AC side of a converter circuit that converts AC power to DC power. For example, when the converter circuit is constructed as a PWM converter that uses a semiconductor switching device, there is a need to detect the current on the AC side of the converter circuit and to use the detected current value for PWM control, and the present invention can also be applied for the AD conversion of the current value in such cases.

The present invention can be applied to any motor control apparatus that detects the current flowing in each winding of a motor and that uses the detected current value for controlling the driving of the motor. For example, in the case of a motor control apparatus for driving motors used in a machine tool, a forging press, an injection molding machine, an industrial robot, or the like, the apparatus commands motor speed, torque, or rotor position command in order to control the operation of each of the motors provided one for each drive axis. In such a motor control apparatus, it is important to accurately detect the current flowing in each winding of the motor, and the present invention can also be applied in such cases.

According to the present invention, it becomes possible to achieve a motor control apparatus equipped with a delta-sigma modulation AD converter that can highly accurately control the driving of a motor and that can avoid the effects of noise due to the switching, etc., of the semiconductor switching device provided in a power converter that supplies drive power to the motor.

Further, the relationship between the time instant at which it is desired to AD-convert the analog data representing the current value and the midpoint of the output time interval of the digital data is clearly defined irrespective of the variation of the modulation clock period that is used for processing in the delta-sigma modulation AD converter. Accordingly, when seen from the command generating unit for generating the drive command, the digital data acquired from the delta-sigma modulation AD converter accurately reflects the result of the conversion of the current value output during the time interval centered at the time instant at which to perform AD conversion. Since the digital data of the current value for creating the drive command can be acquired with higher accuracy, the motor control accuracy can be enhanced. Furthermore, there is no need to add any particular hardware component.

Further, as earlier described, when the power conversion unit is constructed from a power converter such as an inverter circuit that uses a semiconductor switching device, it is important, in order to enhance the motor control accuracy, to reduce the effects of noise due to the switching, etc., of the semiconductor switching device. According to the present invention, the reference signal is created based on the signal synchronized to the peak timing of the triangular carrier signal to be used for the triangular wave comparison PWM switching control, and the digital data after the AD conversion is output when a time equal to one half of the time interval of the digital data to be output based on the reference signal has elapsed; this configuration facilitates reducing the effects of noise due to the switching, etc., of the semiconductor switching device.

According to the invention disclosed in Japanese Unexamined Patent Publication No. 2008-147809, any variation in the modulation clock greatly affects the motor control accuracy; by contrast, according to the present invention, if there is some variation in the modulation clock, since the digital data acquired from the delta-sigma modulation AD converter accurately reflects the result of the conversion of the current value output during the time interval centered at the time instant at which to perform AD conversion, the digital data of the current value for creating the drive command can be acquired with higher accuracy, and the motor control accuracy can thus be enhanced.

What is claimed is:

1. A motor control apparatus comprising:
    a power conversion unit which supplies drive power to a motor;
    a current detection unit which detects the value of a current flowing from said power conversion unit to said motor;
    a delta-sigma modulation AD converter which converts said current value detected by said current detection unit into digital data by using a modulation clock as a system clock, wherein said delta-sigma modulation AD converter starts to count the number of clock pulses of said modulation clock upon reception of a reference signal and, when the number of clock pulses counted reaches a predetermined count value, outputs said digital data obtained during a prescribed time interval which contains the reception time of said reference signal;
    a command generating unit which generates, using said digital data supplied from said delta-sigma modulation AD converter, a drive command for commanding said power conversion unit to output commanded drive power; and
    a reference signal generating unit which generates and outputs a signal that defines timing for said command generating unit to acquire a current value necessary to create said desired drive command from said current value detected by said current detection unit as said reference signal,
    wherein said predetermined count value is set equal to one half of the number of modulation clock pulses that corresponds to said prescribed time interval.

2. The motor control apparatus according to claim 1, wherein said delta-sigma modulation AD converter includes:
    a modulator which outputs a bitstream signal by delta-sigma modulating said current value supplied from said current detection unit by using said modulation clock as said system clock; and
    a digital low-pass filter which, when the number of clock pulses started to be counted upon reception of said reference signal reaches said predetermined count value, outputs said digital data by removing quantization noise from said bitstream signal output during said prescribed time interval that contains the reception time of said reference signal.

3. The motor control apparatus according to claim 1, wherein said delta-sigma modulation AD converter includes a counter which starts to count the number of clock pulses of said modulation clock upon reception of said reference signal.

4. The motor control apparatus according to claim 1, wherein the length of said time interval is set in accordance with a time interval between two switching actions of a switching device that respectively occur before and after the time that the number of clock pulses counted reaches said predetermined count value.

5. The motor control apparatus according to claim 4, wherein the length of said time interval is set in accordance with the magnitude of a voltage application command to said motor which is used to create said drive command that said command generating unit supplies to said power conversion unit.

6. The motor control apparatus according to claim 4, further comprising a speed detection unit which detects rotational speed of said motor, and wherein
    the length of said time interval is set in accordance with the rotational speed of said motor detected by said speed detection unit.

7. The motor control apparatus according to claim 4, wherein said motor control apparatus controls a motor for driving a feed axis of a machine tool that performs cutting, and wherein the length of said time interval is set so as to differ when said machine tool is performing a cutting operation than when said machine tool is performing a non-cutting operation.

8. The motor control apparatus according to claim 1, wherein said power conversion unit is a power converter that converts input power to desired output power by switching on and off a switching device provided therein, and wherein said command generating unit generates and outputs a PWM switching signal for controlling the switching operation of said switching device as said drive command by using a triangular carrier signal to be used for triangular wave comparison PWM switching control and said digital data supplied from said delta-sigma modulation AD converter, and said reference signal is a signal synchronized to a peak timing of said triangular carrier signal.

9. The motor control apparatus according to claim 8, wherein said predetermined count value is set equal to one half of the number of modulation clock pulses that corresponds to said prescribed time interval, and the length of said time interval is set in accordance with a carrier frequency of said triangular carrier signal and is set shorter than a time interval between two switching actions of said switching device that respectively occur before and after the time that the number of clock pulses counted reaches said predetermined count value.

* * * * *